(12) United States Patent
Chong et al.

(10) Patent No.: US 7,692,931 B2
(45) Date of Patent: Apr. 6, 2010

(54) MICROELECTRONIC PACKAGES WITH LEADFRAMES, INCLUDING LEADFRAMES CONFIGURED FOR STACKED DIE PACKAGES, AND ASSOCIATED SYSTEMS AND METHODS

(75) Inventors: Chin Hui Chong, Singapore (SG); Choon Kuan Lee, Singapore (SG); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 11/509,291

(22) Filed: Aug. 23, 2006

(65) Prior Publication Data

US 2008/0012110 A1    Jan. 17, 2008

(30) Foreign Application Priority Data

Jul. 17, 2006    (SG)    ............... 200604777-3

(51) Int. Cl.
*H05K 7/00*    (2006.01)
(52) U.S. Cl. ........................... 361/790; 361/803
(58) Field of Classification Search ......... 361/772–774, 361/790, 803; 174/259–261; 257/685, 686, 257/700
See application file for complete search history.

(56) References Cited

U.S. PATENT DOCUMENTS

| | | | |
|---|---|---|---|
| 3,746,934 A | 7/1973 | Stein | |
| 5,107,328 A | 4/1992 | Kinsman | |
| 5,128,831 A | 7/1992 | Fox, III et al. | |
| 5,138,434 A | 8/1992 | Wood et al. | |
| 5,145,099 A | 9/1992 | Wood et al. | |
| 5,252,857 A | 10/1993 | Kane et al. | |
| 5,356,838 A | 10/1994 | Kim | |
| 5,518,957 A | 5/1996 | Kim | |
| 5,554,886 A | 9/1996 | Song et al. | |
| 5,593,927 A | 1/1997 | Farnworth et al. | |
| 5,677,566 A | 10/1997 | King et al. | |
| 5,760,471 A | 6/1998 | Fujisawa et al. | |
| 5,801,439 A | 9/1998 | Fujisawa et al. | |
| 5,811,877 A | 9/1998 | Miyano et al. | |

(Continued)

FOREIGN PATENT DOCUMENTS

EP    0522518 A2    1/1993

(Continued)

OTHER PUBLICATIONS

Search Report and Written Opinion issued Mar. 9, 2009 in Singapore Application No. 200604777-3.

(Continued)

*Primary Examiner*—Jinhee J Lee
*Assistant Examiner*—Yuriy Semenenko
(74) *Attorney, Agent, or Firm*—Perkins Coie LLP (57) ABSTRACT

Microelectronic packages with leadframes, including leadframes configured for stacked die packages, and associated systems and methods are disclosed. A system in accordance with one embodiment includes a support member having first package bond sites electrically coupled to leadframe bond sites. A microelectronic die can be carried by the support member and electrically coupled to the first packaged bond sites. A leadframe can be attached to the leadframe bond sites so as to extend adjacent to the microelectronic die, with the die positioned between the leadframe and the support member. The leadframe can include second package bond sites facing away from the first package bond sites. An encapsulant can at least partially surround the leadframe and the microelectronic die, with the first and second package bond sites accessible from outside the encapsulant.

38 Claims, 10 Drawing Sheets

U.S. PATENT DOCUMENTS

| | | |
|---|---|---|
| 5,826,628 A | 10/1998 | Hamilton |
| 5,835,988 A | 11/1998 | Ishii et al. |
| 5,851,845 A | 12/1998 | Wood et al. |
| 5,879,965 A | 3/1999 | Jiang et al. |
| 5,883,426 A | 3/1999 | Tokuno et al. |
| 5,891,797 A | 4/1999 | Farrar |
| 5,894,218 A | 4/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,986,209 A | 11/1999 | Tandy |
| 5,990,566 A | 11/1999 | Farnworth et al. |
| 5,994,784 A | 11/1999 | Ahmad |
| RE36,469 E | 12/1999 | Wood et al. |
| 6,002,167 A | 12/1999 | Hatano et al. |
| 6,004,867 A | 12/1999 | Kim et al. |
| 6,008,070 A | 12/1999 | Farnworth |
| 6,018,249 A | 1/2000 | Akram et al. |
| 6,020,624 A | 2/2000 | Wood et al. |
| 6,020,629 A | 2/2000 | Farnworth et al. |
| 6,028,365 A | 2/2000 | Akram et al. |
| 6,030,858 A | 2/2000 | Cha et al. |
| 6,048,744 A | 4/2000 | Corisis et al. |
| 6,051,878 A | 4/2000 | Akram et al. |
| 6,064,194 A | 5/2000 | Farnworth et al. |
| 6,066,514 A | 5/2000 | King et al. |
| 6,072,233 A | 6/2000 | Corisis et al. |
| 6,072,236 A | 6/2000 | Akram et al. |
| 6,089,920 A | 7/2000 | Farnworth et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,122 A | 8/2000 | Wood et al. |
| 6,111,312 A | 8/2000 | Hirumuta et al. |
| 6,124,634 A | 9/2000 | Akram et al. |
| 6,130,474 A | 10/2000 | Corisis |
| 6,133,068 A | 10/2000 | Kinsman |
| 6,133,622 A | 10/2000 | Corisis et al. |
| 6,146,919 A | 11/2000 | Tandy |
| 6,148,509 A | 11/2000 | Schoenfeld et al. |
| 6,150,710 B1 | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,175,149 B1 | 1/2001 | Akram |
| 6,184,465 B1 | 2/2001 | Corisis |
| 6,187,615 B1 | 2/2001 | Kim et al. |
| 6,188,232 B1 | 2/2001 | Akram et al. |
| 6,198,172 B1 | 3/2001 | King et al. |
| 6,201,304 B1 | 3/2001 | Moden |
| 6,212,767 B1 | 4/2001 | Tandy |
| 6,214,716 B1 | 4/2001 | Akram |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,666 B1 | 5/2001 | Corisis et al. |
| 6,235,552 B1 | 5/2001 | Kwon et al. |
| 6,235,554 B1 | 5/2001 | Akram et al. |
| 6,239,489 B1 | 5/2001 | Jiang |
| 6,246,108 B1 | 6/2001 | Corisis et al. |
| 6,246,110 B1 | 6/2001 | Kinsman et al. |
| 6,247,629 B1 | 6/2001 | Jacobson et al. |
| 6,252,772 B1 | 6/2001 | Allen |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,766 B1 | 7/2001 | Moden |
| 6,271,580 B1 | 8/2001 | Corisis |
| 6,281,042 B1 | 8/2001 | Ahn et al. |
| 6,281,577 B1 | 8/2001 | Oppermann et al. |
| 6,284,571 B1 | 9/2001 | Corisis et al. |
| 6,285,204 B1 | 9/2001 | Farnworth |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,313,998 B1 * | 11/2001 | Kledzik et al. .............. 361/767 |
| 6,320,251 B1 | 11/2001 | Glenn |
| 6,326,697 B1 | 12/2001 | Farnworth |
| 6,326,698 B1 | 12/2001 | Akram |
| 6,329,222 B1 | 12/2001 | Corisis et al. |
| 6,329,705 B1 | 12/2001 | Ahmad |
| 6,331,221 B1 | 12/2001 | Cobbley |
| 6,331,448 B1 | 12/2001 | Ahmad |
| 6,344,976 B1 | 2/2002 | Schoenfeld et al. |
| 6,388,333 B1 * | 5/2002 | Taniguchi et al. ........... 257/777 |
| 6,407,381 B1 | 6/2002 | Glenn et al. |
| 6,429,528 B1 | 8/2002 | King et al. |
| 6,432,796 B1 | 8/2002 | Peterson |
| 6,433,418 B1 | 8/2002 | Fujisawa et al. |
| 6,437,449 B1 | 8/2002 | Foster |
| 6,437,586 B1 | 8/2002 | Robinson |
| 6,483,044 B1 | 11/2002 | Ahmad |
| 6,503,780 B1 | 1/2003 | Glenn et al. |
| 6,548,376 B2 | 4/2003 | Jiang |
| 6,548,757 B1 | 4/2003 | Russell et al. |
| 6,552,910 B1 | 4/2003 | Moon et al. |
| 6,560,117 B2 | 5/2003 | Moon |
| 6,564,979 B2 | 5/2003 | Savaria |
| 6,576,531 B2 | 6/2003 | Peng et al. |
| 6,607,937 B1 | 8/2003 | Corisis |
| 6,614,092 B2 | 9/2003 | Eldridge et al. |
| 6,652,910 B2 | 11/2003 | Pan et al. |
| 6,746,894 B2 | 6/2004 | Fee et al. |
| 6,864,566 B2 | 3/2005 | Choi et al. |
| 6,885,107 B2 | 4/2005 | Kinsman |
| 6,900,530 B1 | 5/2005 | Tsai |
| 7,006,360 B2 * | 2/2006 | Kim .......................... 361/790 |
| 7,015,587 B1 | 3/2006 | Poddar |
| 7,119,427 B2 * | 10/2006 | Kim .......................... 257/686 |
| 7,394,148 B2 * | 7/2008 | Karnezos .................... 257/686 |
| 2002/0096760 A1 | 7/2002 | Simelgor et al. |
| 2005/0101056 A1 | 5/2005 | Song et al. |
| 2005/0242421 A1 | 11/2005 | Tandy |
| 2006/0068527 A1 | 3/2006 | Cobbley et al. |
| 2006/0138628 A1 | 6/2006 | Tzu |
| 2007/0013038 A1 | 1/2007 | Yang |
| 2007/0108560 A1 | 5/2007 | Tang et al. |
| 2007/0210441 A1 | 9/2007 | Corisis et al. |
| 2009/0026600 A1 | 1/2009 | Koon et al. |
| 2009/0045489 A1 | 2/2009 | Koon et al. |

FOREIGN PATENT DOCUMENTS

| | | |
|---|---|---|
| EP | 1503417 A1 | 2/2005 |
| JP | 60206058 A | 10/1985 |
| JP | 61018164 A | 1/1986 |
| KR | 20020024654 A | 4/2002 |
| WO | WO-2005017968 A2 | 2/2005 |

OTHER PUBLICATIONS

U.S. Appl. No. 11/453,464, filed Jun. 14, 2006, Corisis et al.
Unisemicon, Product Information, Stack Package Product for DDR/DDR2, 2 pages, retrieved from the Internet on May 30, 2006, <http://www.unisemicon.com/wizhome/menu_48.html>.

* cited by examiner

MICROELECTRONIC PACKAGES WITH LEADFRAMES, INCLUDING LEADFRAMES CONFIGURED FOR STACKED DIE PACKAGES, AND ASSOCIATED SYSTEMS AND METHODS

CROSS-REFERENCE TO RELATED APPLICATION

This application claims foreign priority benefits of Singapore Application No. 200604777-3 filed Jul. 17, 2006.

TECHNICAL FIELD

The present disclosure is directed generally to microelectronic packages with leadframes, including leadframes configured for stacked die packages, and associated systems and methods.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

In one conventional arrangement, the die is mounted to a supporting substrate (e.g., a printed circuit board), and the die bond pads are electrically coupled to corresponding bond pads of the substrate with wirebonds. After encapsulation, the substrate can be electrically connected to external devices with solder balls or other suitable connections. Accordingly, the substrate supports the die and provides an electrical link between the die and the external devices.

In other conventional arrangements, the die can be mounted to a leadframe that has conductive leadfingers connected to a removable frame. The frame temporarily supports the leadfingers in position relative to the die during manufacture. Each leadfinger is wirebonded to a corresponding bond pad of a die, and the assembly is encapsulated in such a way that the frame and a portion of each of the leadfingers extends outside the encapsulating material. The frame is then trimmed off, and the exposed portions of each leadfinger can be bent to form pins for connecting the die to external components.

Die manufacturers have come under increasing pressure to reduce the size of their dies and the volume occupied by the dies, and to increase the capacity of the resulting encapsulated assemblies. One approach to addressing these issues has been to stack multiple dies on top of each other so as to make increased use of the limited surface area on the circuit board or other element to which the dies are mounted. One drawback with some of the existing stacking techniques is that one of the dies may fail during a following-on test process. When this occurs, the entire package, including operational dies, is typically discarded because it is not practical to replace a single die within a package. Another potential drawback is that the stacked dies can occupy a significant volume in a vertical direction, which can in some cases reduce the benefits associated with stacking the dies. Accordingly, there is a need for techniques that reduce the thickness of stacked die packages, and improve the reliability of such packages.

DETAILED DESCRIPTION

The present disclosure relates generally to microelectronic packages having leadframes, including leadframes configured for stacked packages, and associated systems and methods. For example, one system includes a support member having first package bond sites and leadframe bond sites that are electrically coupled to the first package bond sites. A microelectronic die carried by the support member is electrically coupled to the first package bond sites. The leadframe can be attached to the leadframe bond sites and can extend adjacent to the microelectronic die, with the microelectronic die positioned between the leadframe and the support member. The leadframe can have second package bond sites facing away from the first package bond sites. An encapsulant at least partially surrounds the leadframe and the microelectronic die, with the first and second package bond sites accessible from outside the encapsulant.

In a further particular aspect, the support member, the microelectronic die, the leadframe and the encapsulant form a first microelectronic package, and the system can further include a second microelectronic package having a configuration generally similar to that of the first, with the second microelectronic package stacked on the first, and with the first package bond sites of the second microelectronic package electrically connected to the second package bond sites of the first microelectronic package. In yet further aspects, one or more of the packages can itself include multiple microelectronic dies positioned between the corresponding leadframe and the corresponding support member.

Other aspects are directed to a leadframe for electrical coupling to a microelectronic die. The leadframe can include a conductive frame and a plurality of conductive leadfingers that are connected to and extend inwardly from the frame. Individual leadfingers can have a leadfinger surface that faces in a first direction and is located in a leadfinger plane. The individual leadfingers can further have an electrically conductive bond site with a bonding surface that is offset away from the leadfinger plane in the first direction. Leadfingers having such a construction can be positioned within microelectronic packages, with the offset bonding surfaces accessible from outside the encapsulant of the package, so as to permit coupling to the microelectronic die within the package.

Further aspects are directed to methods for making a microelectronic die system. One such method can include carrying a microelectronic die with a support member having first package bond sites and leadframe bond sites that are electrically coupled to the first package bond sites. The method can further include electrically coupling the microelectronic die to the first package bond sites, and positioning the leadframe adjacent to the microelectronic die, with the microelectronic die located between the leadframe and the support member, and with second package bond sites of the leadframe facing away from the microelectronic die. The method can further include electrically connecting the leadframe to the leadframe bond sites, at least partially surrounding the leadframe and the die with an encapsulant, and allowing access to the first and second package bond sites from outside the encapsulant. Accordingly, the package can be coupled to external devices, and can be stacked to improve device density.

In particular aspects, allowing access to the second package bond sites can include removing encapsulant adjacent to the package bond sites, grinding the encapsulant to expose the package bond sites, and/or restricting the encapsulant from being disposed adjacent to the second package bond sites. In further aspects, the support member can include a circuit board, and can be the only support member within the encapsulant.

Many specific details of certain embodiments of the invention are set forth in the following description and in FIGS. 1-8 to provide a thorough understanding of these embodiments. One skilled in the art, however, will understand that the present invention may have additional embodiments, and that the invention may be practiced without several of the details described below.

Figure 1:
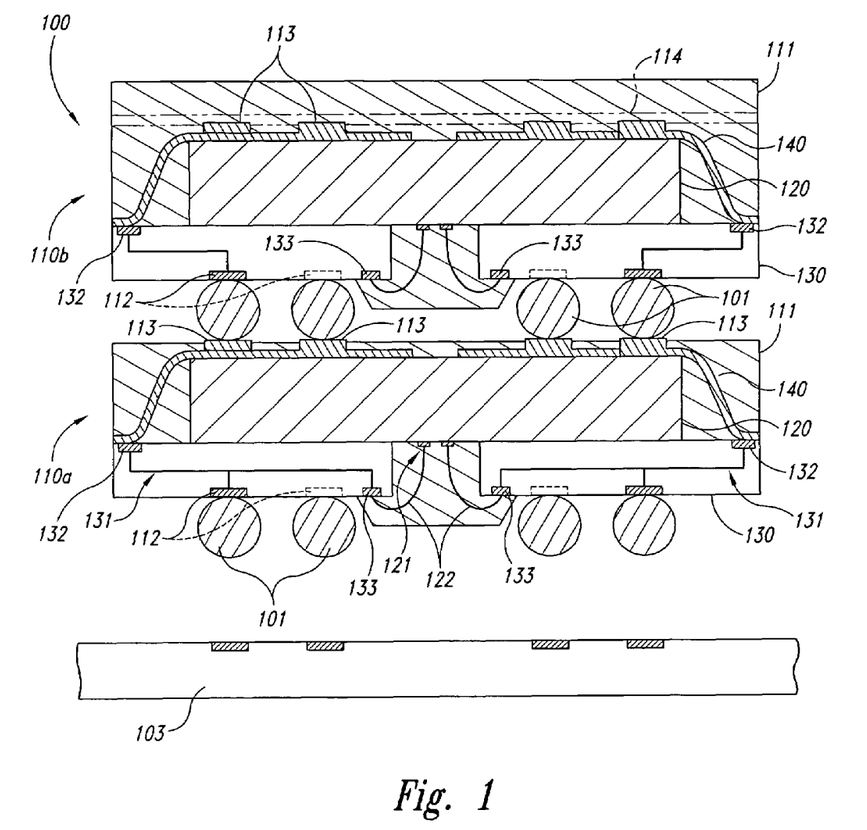
FIG. 1 is a partially schematic, cross-sectional side view of a system that includes microelectronic die packages configured and stacked in accordance with an embodiment of the invention.

FIG. 1 is a partially schematic, cross-sectional side view of a system 100 that includes stacked microelectronic packages configured in accordance with an embodiment of the invention. The system 100 can include multiple stacked packages 110 (e.g., two packages, shown as a first package 110*a* and a second package 110*b*), each having a generally similar configuration. For example, each package 110 can include a support member 130 (e.g., a circuit board), a microelectronic die 120 (e.g., a memory chip or a processor chip), and a leadframe 140 that provides for electrical connections between the microelectronic die 120 and other devices, including, but not limited to, other stacked packages.

Referring to the first package 110*a*, the support member 130 can both carry the microelectronic die 120 and provide electrical communication to and from the die 120. Accordingly, the support member 130 can have support member bond sites 133 that are electrically coupled to corresponding die bond sites 121 of the die 120. In an embodiment shown in FIG. 1, wirebonds 122 provide the electrical coupling between the die bond sites 121 and the support member bond sites 133, and in other embodiments, other electrical couplings (e.g., solder balls) form this link. The support member 130 can also include internal circuitry 131 that connects the support member bond sites 133 with other bonds sites, including first package bond sites 112 and leadframe bond sites 132.

The first package bond sites 112 provide communication to other devices external to the package 110 via solder balls 101 or other electrically conductive couplers. Some of the first package bond sites 112 are located out of the plane of FIG. 1, as indicated by dashed lines. The leadframe bond sites 132 provide communication to second package bond sites 113 via the leadframe 140. Accordingly, the die 120 can communicate with external devices 103 via the first package bond sites 112 and/or the second package bond sites 113.

Each package 110 can include an encapsulant 111 that surrounds and protects the internal components, including the wirebonds 122 and the leadframe 140. The encapsulant 111 can be positioned and/or configured with the first package bond sites 112 and the second package bond sites 113 exposed for electrical coupling to other components. The other components can include other packages 110 (e.g., when the packages 110 are stacked), and/or external circuit boards, and/or any of a wide variety of intermediate and/or end-user devices, such as computing devices, communication devices, testing devices or other electronic components.

Stacked packages can, but need not have generally similar configurations. For example, as shown in FIG. 1, the two packages 110*a*, 110*b* can each have a generally similar arrangement of internal components, but the second package 110*b* can have its encapsulant 111 arranged so as to cover over the second package bond sites 113. Accordingly, the second package 110*b* can be located at the top of a stack of packages (as shown in FIG. 1), or it can be used singly. In other embodiments, the second package 110*b* can have an encapsulant arranged identically to that shown for the first package 110*a*, but can include an optional covering 114 (shown in dashed lines in FIG. 1) to protect the otherwise exposed second bond sites 113. In still further embodiments, the system 100 can include dissimilar packages stacked on top of each other.

Figure 2A:
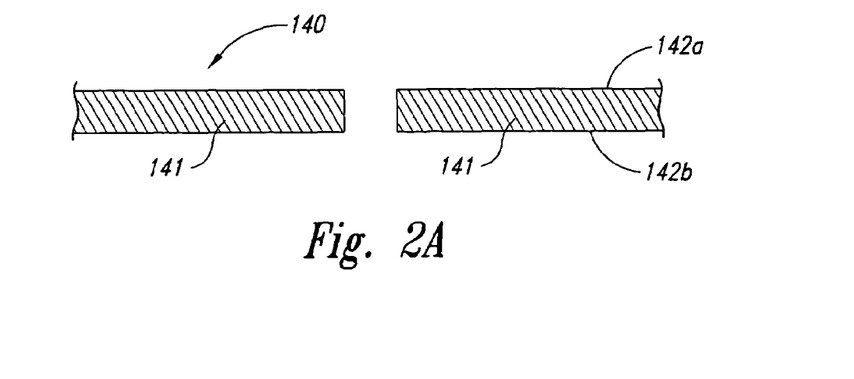
FIGS. 2A-2F illustrate a process for forming a leadframe in accordance with an embodiment of the invention.

FIGS. 2A-2F illustrate a representative process for forming a leadframe 140, such as the one shown in FIG. 1. FIG. 2A illustrates the central portion of the leadframe 140, including leadfingers 141 that extend inwardly toward each other from a surrounding frame (described later with reference to FIG. 2F). Each leadfinger 141 can include a first leadfinger surface 142*a* and a second leadfinger surface 142*b* facing opposite from the first leadfinger surface 142*a*.

Figure 2B:
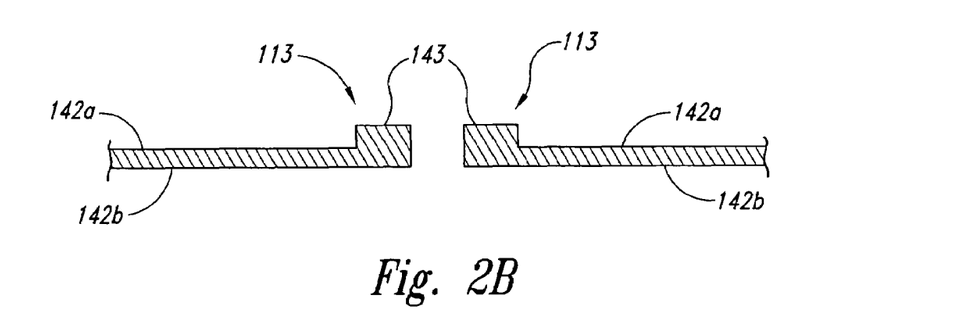
Figure 2C:
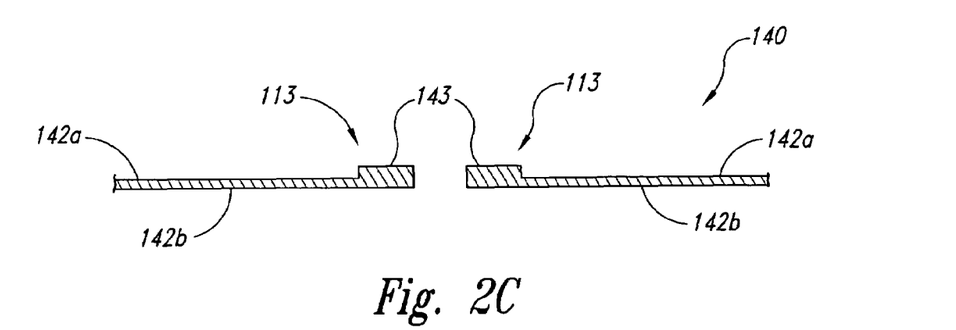
Figure 2D:
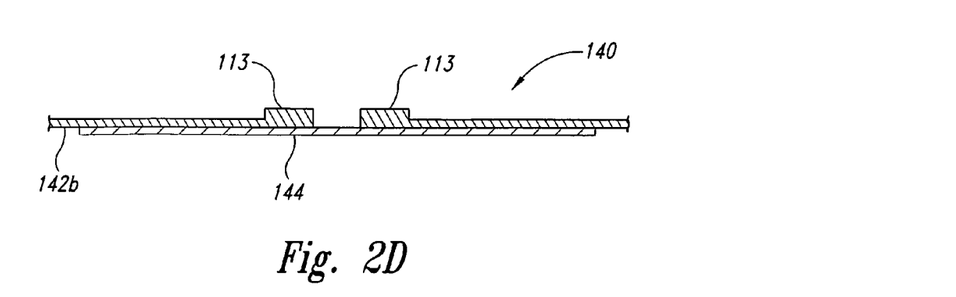

FIG. 2B illustrates a process for forming the second package bond sites 113 at the leadfingers 141. In one aspect of this embodiment, the second package bond sites 113 are formed by etching or otherwise removing material from the first leadfinger surface 142*a* so as to leave projections having a bonding surface 143 that is generally parallel to the recessed first leadfinger surface 142*a*, but offset away from the first leadfinger surface 142*a*. Accordingly, the first leadfinger surface 142*a* is located generally in a leadfinger plane, and the bonding surface 143 is offset outwardly away from the leadfinger plane. In a particular embodiment, the bonding surface 143 is generally flat, but it can have other shapes in other embodiments. In FIG. 2C, material can be removed from the first leadfinger surface 142*a*, the second leadfinger surface 142*b*, and/or the bonding surfaces 143 to reduce the overall thickness of the leadframe 140. In FIG. 2D, an adhesive 144 is attached to the second leadfinger surface 142*b* in preparation for bonding the leadframe 140 to a corresponding microelectronic die.

Figure 2E:
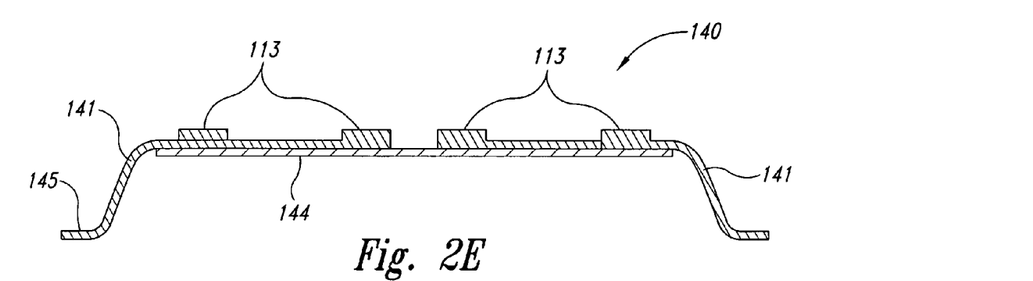
Figure 2F:
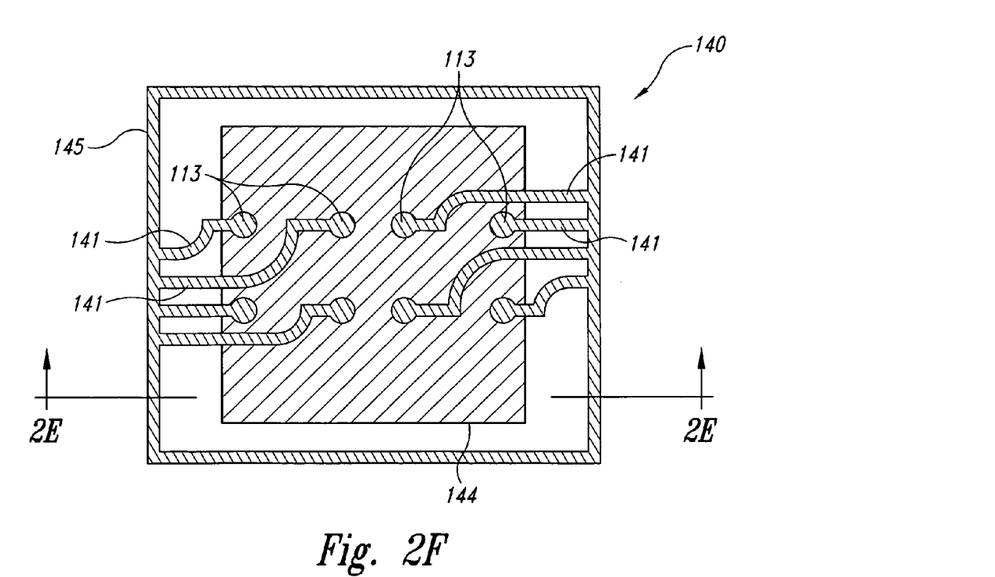

FIG. 2E is a cross-sectional side elevation view of an entire leadframe 140, with an adhesive 144 attached, taken substantially along line 2E-2E of FIG. 2F. Referring to FIGS. 2E and 2F, the leadframe 140 can include a frame 145 from which the leadfingers 141 extend. Each leadfinger 141 has a single second package bond site 113, but adjacent leadfingers 141 have different lengths and are offset relative to each other to properly align neighboring second package bond sites 113. The leadfingers 141 can also be bent as shown in FIG. 2E so as to fit over a corresponding microelectronic die, with the frame 145 holding the leadfingers 141 in place during the attachment process. In a representative embodiment, the leadframe 140 is generally self-supporting. For example, although it is relatively thin and flexible, it can keep its shape, and is therefore different than typical internal redistribution layers, which are formed directly on or in a microelectronic die or support member using a deposition process.

FIGS. 3A-3G illustrate a process for attaching the leadframe 140 to a microelectronic die 120, and completing the formation of the resulting package. Beginning with FIG. 3A, a microelectronic die 120 is attached to the support member 130 so that the die bond sites 121 are aligned with an aperture in the support member 130. Wirebonds 122 are then connected between the die bond sites 121 and the support member bond sites 133. The support member bond sites 133 are in electrical communication with the leadframe bond sites 132, as discussed above with reference to FIG. 1. Each of the leadframe bond sites 132 can optionally include a solder ball 134 or other arrangement for attaching to the leadframe and providing electrical signals to the leadframe.

Figure 3A:
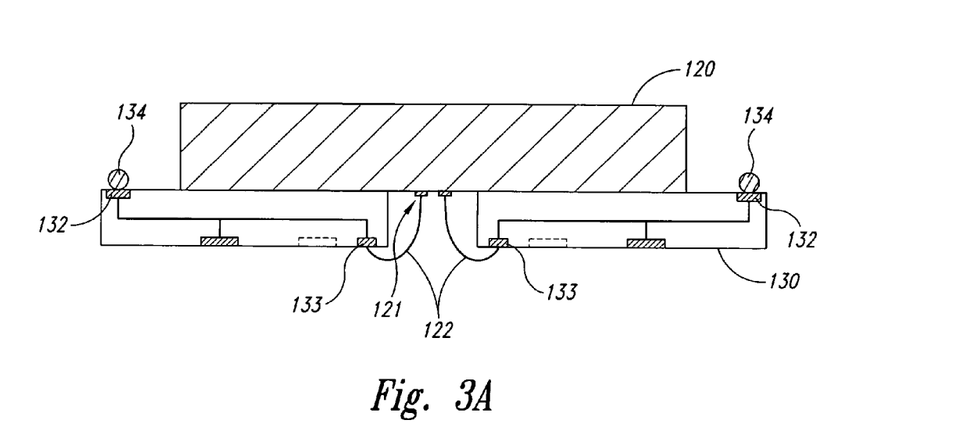
FIGS. 3A-3G illustrate a process for encapsulating a microelectronic die and a leadframe in accordance with an embodiment of the invention.
Figure 3B:
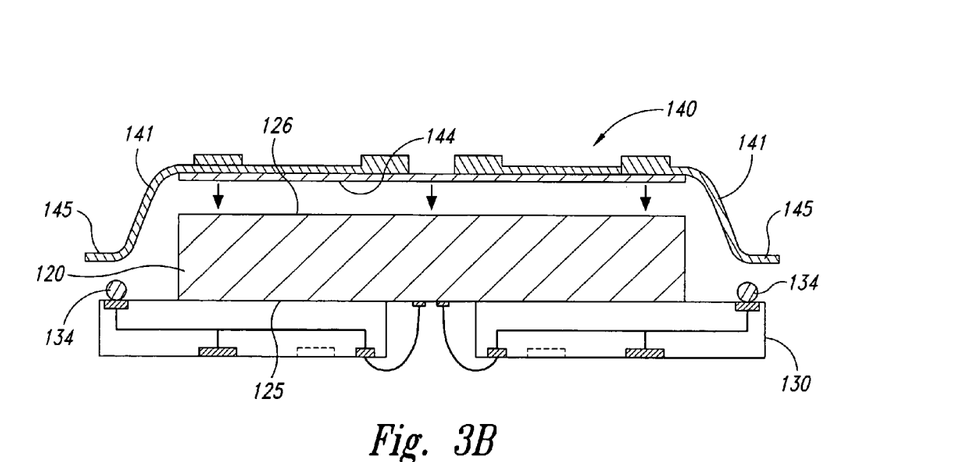

FIG. 3B illustrates the leadframe 140 positioned over the microelectronic die 120 in preparation for attaching it to both the support member 130 and the microelectronic die 120. The microelectronic die has a first surface 125 facing toward the support member 130, and a second surface 126 facing toward the leadframe 140. The leadframe 140 can be attached to the microelectronic die 120 with the adhesive 144, and the leadframe 140 can be attached and electrically coupled to the support member 130 via the solder balls 134. Accordingly, unlike many existing applications of leadframes, the illustrated leadframe 140 does not have wirebonds attached to it. A suitable reflow process and/or curing process can be used to form the foregoing attachments to the leadframe 140. For purposes of illustration, the reflowed solder balls 134 and cured adhesive 144 are not shown in the following figures.

Figure 3C:
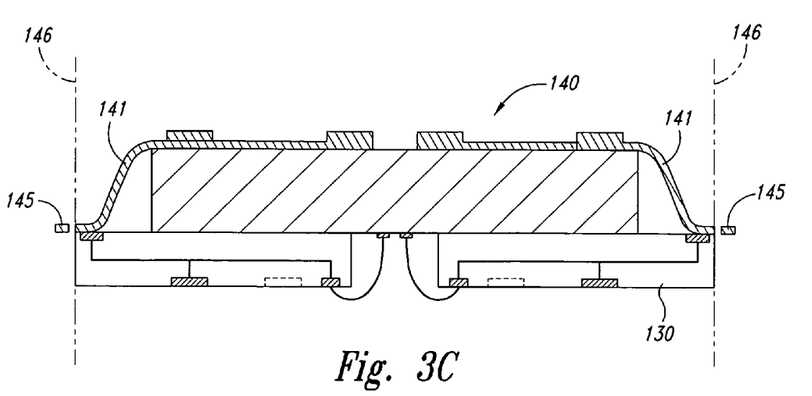
Figure 3D:
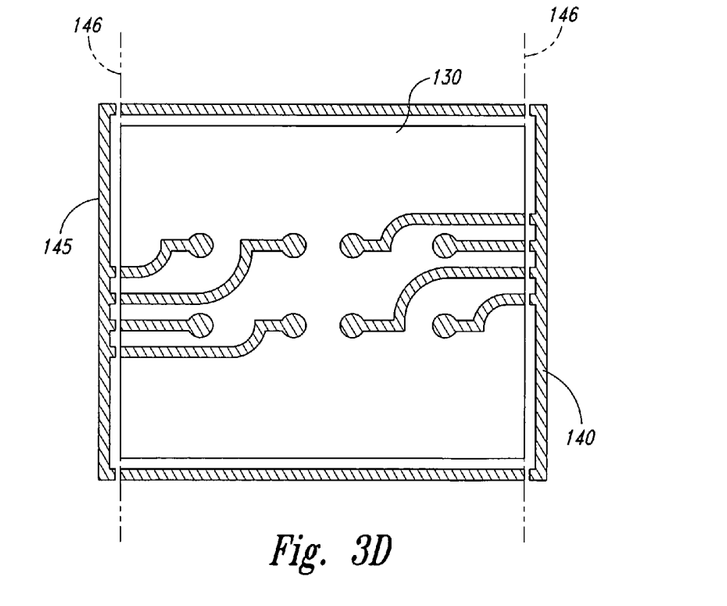
Figure 3E:
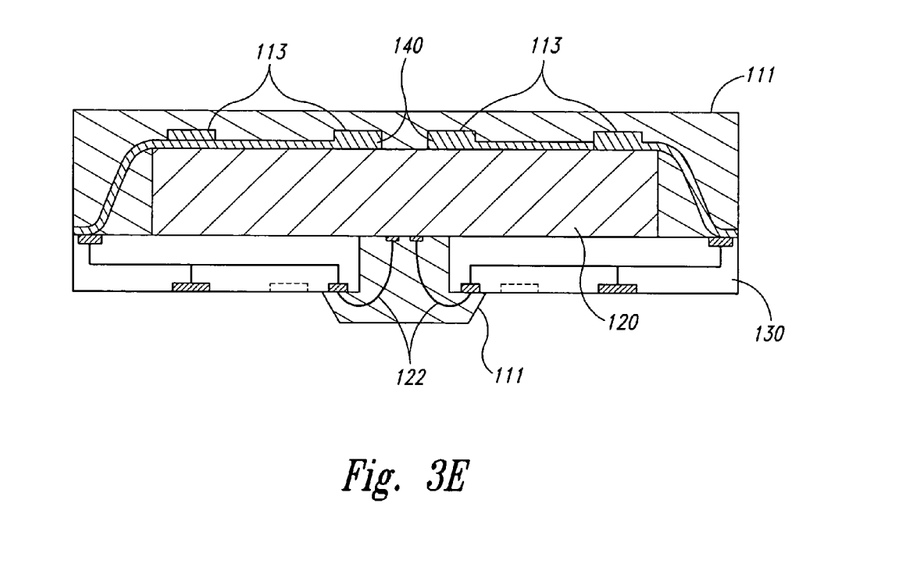
Figure 3F:
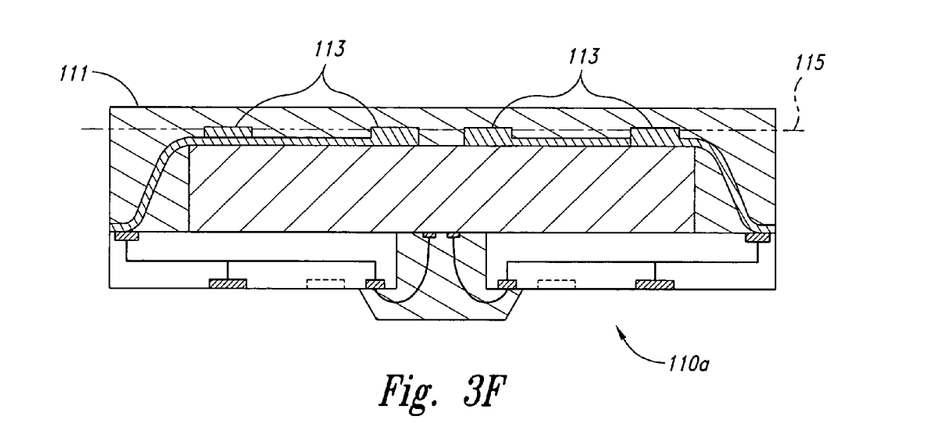

FIGS. 3C is a partially schematic, cross-sectional side view of the support member 130 and the leadframe 140, as the outer frame 145 of the leadframe 140 is separated from the rest of the leadframe 140 along trim lines 146. FIG. 3D is a plan view of the arrangement shown in FIG. 3C. Once the outer frame 145 has been separated, the leadframe 140, the support member 130, and the microelectronic die 120 can be encapsulated, as shown in FIG. 3E. In a particular aspect of this arrangement, the support member 130, with the microelectronic die 120 and the leadframe 140 attached, is placed in a mold and the encapsulant 111 is injected in the mold so as to cover the second package bond sites 113. As shown in FIG. 3F, the portion of the encapsulant 111 covering the second package bond sites 113 can then be removed to expose the second package bond sites 113. For example, a grinding process, laser removal process, or other appropriate process can be used to remove the encapsulant 111 down to a removal line 115. The encapsulant 111 can be removed from across the entirety of the upper surface of the package, or it can be selectively removed from just the second package bond sites 113, for example, to form "wells" that contain the solder balls or other electrical couplers that are later placed at the second package bond sites 113.

In another arrangement, the step of removing the portion of the encapsulant 111 overlying the second package bond sites 113 can be eliminated by preventing the encapsulant 111 from being disposed on the second package bond sites 113 in the first place. For example, the mold in which the first package 110a is placed during the encapsulation process can include pins or other removable structures that cover over the second package bond sites 113 and prevent the encapsulant 111 from contacting and adhering to the second package bond sites 113. Also, as discussed above with reference to FIG. 1, if the particular package need not have the second package bond sites 113 exposed (e.g., if the package is intended to be placed at the top of a package stack), then the overlying encapsulant 111 need not be removed.

Figure 3G:
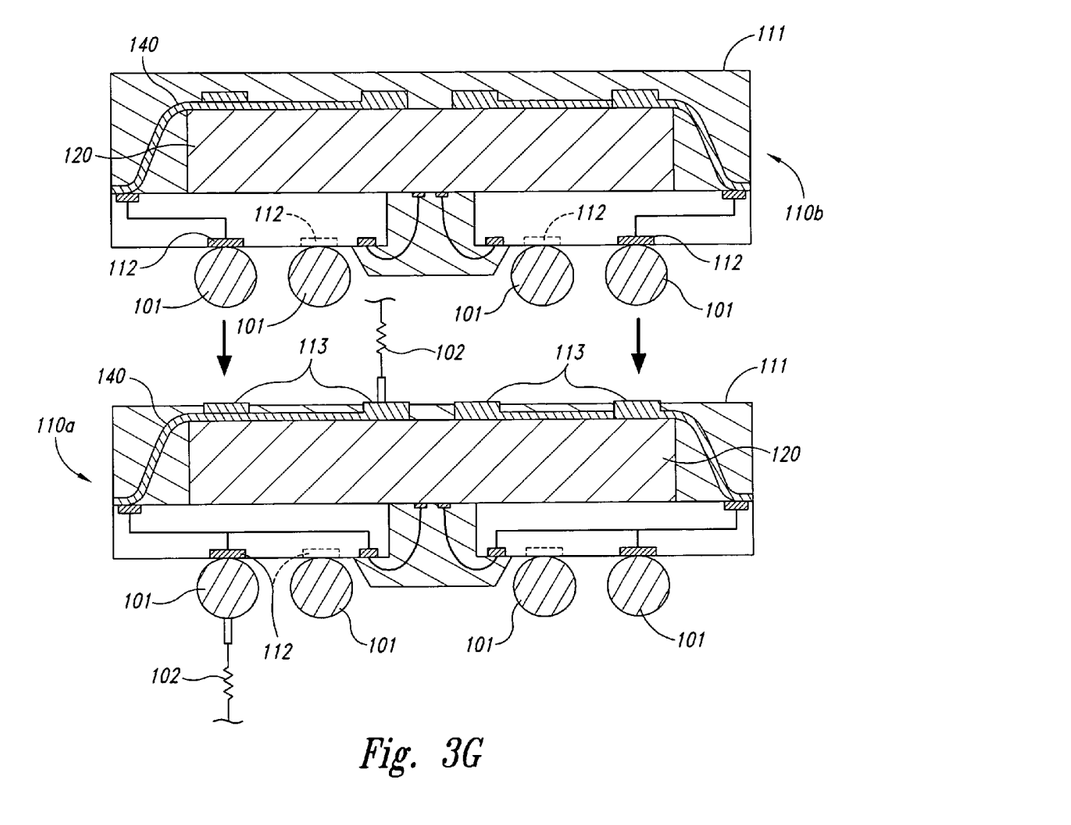

FIG. 3G illustrates both the first package 110a and the second package 110b described above with reference to FIG. 1. Solder balls 101 have been attached to the first package bond sites 112 of each package 110a, 110b. Prior to attaching the packages 110a, 110b to each other, each package can be separately tested using a probe 102 (shown schematically in FIG. 3G) or another device that communicates with the internal microelectronic die 120 via the first package bond sites 112 and/or the second package bond sites 113. In this manner, each of the packages 110a, 110b can be electronically tested prior to the stacking operation. An advantage of this arrangement is that the likelihood for stacking a "bad die" with a "good die" is reduced or eliminated. Accordingly, the process of stacking the packages 110a, 110b into a final assembly can be completed using only known good packages.

The process for stacking the packages 110a, 110b can include placing the second package 110b on the first package 110a, with the first package bond sites 112 of the second package 110b aligned with the second package bond sites 113 of the first package 110a. When solder balls 101 are used to connect the packages 110a, 110b, a reflow operation can be used to connect the solder between the two sets of package bond sites 112, 113.

One feature of at least some of the embodiments described above with reference to FIGS. 1-3G is that each package 110 can include a single support member 130, and an arrangement of stacked packages can include as many support members as there are packages 110. This is unlike some existing arrangements for stacking microelectronic dies, in which additional support members are used to provide the interconnections between stacked dies. Unlike these arrangements, embodiments such as those described above with reference to FIGS. 1-3G have no support member positioned between the leadframe and the microelectronic die within a given package. An advantage of reducing the number of support members included in the package (or package stack) is that it can reduce the overall thickness of the stack and therefore the volume occupied by the stack when it is installed in a product (e.g., a computer, cell phone, video device, etc.).

Another feature of at least some of the embodiments described above with reference to FIGS. 1-3G is that they can include leadfingers 141 having bonding surfaces that project away or are offset from the parallel leadfinger surface that faces in the same direction (e.g., the first leadfinger surface 142a shown in FIG. 2B). This arrangement allows the leadfingers 141 (and in particular, the second package bond sites 113) to be accessible from the surface of the package that faces opposite the first package bond sites 112. As a result, the packages may be readily stacked on one another.

Another feature of at least some of the embodiments described above with reference to FIGS. 1-3G is that each package has a volume of encapsulant that is separate from and not integrated with the encapsulant of the other. Accordingly, the packages can be attached to each other and, if necessary, separated from each other at the junctions between the first package bond sites of one package and the second package bond site of the other. This feature allows the packages to be separated (for example, if one package fails), without having to disturb the encapsulant of either package.

Figure 4:
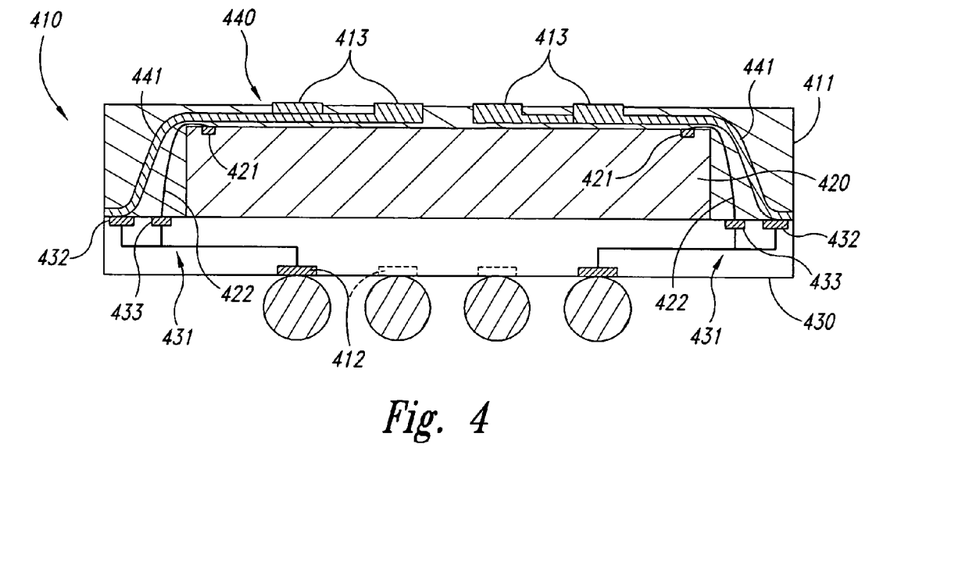
FIG. 4 is a partially schematic, cross-sectional side view of a package having a microelectronic die and leadframe configured in accordance with another embodiment of the invention.

FIGS. 4-8 illustrate packages with microelectronic dies and encapsulated leadframes configured in accordance with further embodiments of the invention. For example, FIG. 4 illustrates a package 410 that includes a microelectronic die 420 carried by a support member 430 having support member bond sites 433. Unlike the arrangement shown in FIG. 1, die bond sites 421 of the microelectronic die 420 face away from the support member bond sites 433 and are connected to the support member bond sites 433 with wire bonds 422 that do not extend through an opening in the support member 430. The package 410 also includes a leadframe 440 having leadfingers 441 that extend not only over the die 420, but also over the wirebonds 422. Other aspects of the package 410 can be generally similar to those described above with reference to FIG. 1. For example, the support member 430 can include support member circuitry 431 that couples the support member bond sites 433 to first package bond sites 412 and to leadframe bond sites 432. The leadframe 440 can carry second package bond sites 413 that are accessible through a surrounding body of encapsulant 411 for electrical coupling to the package 410.

Figure 5:
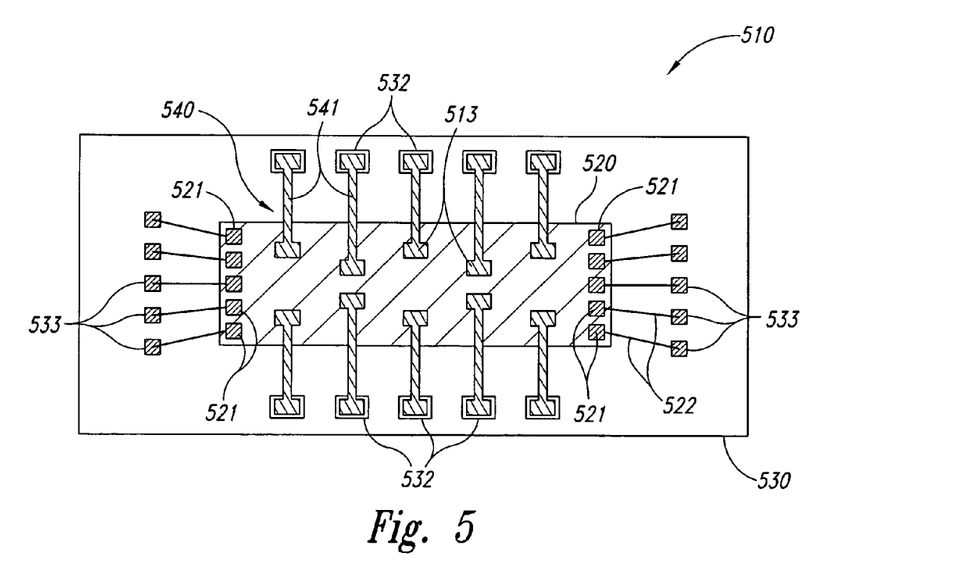
FIG. 5 is a partially schematic, top plan view of a microelectronic die carried by a support member and connected to a leadframe in accordance with another embodiment of the invention.

FIG. 5 is a top plan view of a package 510 having an arrangement somewhat similar to that described above with reference to FIG. 4, but with the wirebonds oriented in a different direction from, and not directly underneath, the leadfingers. For example, the package 510 can include a support member 530 carrying a microelectronic die 520 having die bond sites 521 positioned toward the ends of the die 520 and connected to support member bond sites 533 positioned toward the ends of the corresponding support member 530. The support member bond sites 533 are connected to leadframe bond sites 532 with internal circuitry (not shown) within the support member 530. The leadframe 540 can include leadfingers 541 that are electrically bonded to the leadframe bond sites 532, and that extend over the orthogonally located sides of the die 520, so as not to pass directly over the wirebonds 522. The leadfingers 541 can include second package bond sites 513 that are accessible for coupling in a manner generally similar to that described above. Orienting the leadfingers 541 away from the wirebonds 522 avoids physical interference between these elements, and can also reduce or eliminate electrical interference between these elements.

Figure 6:
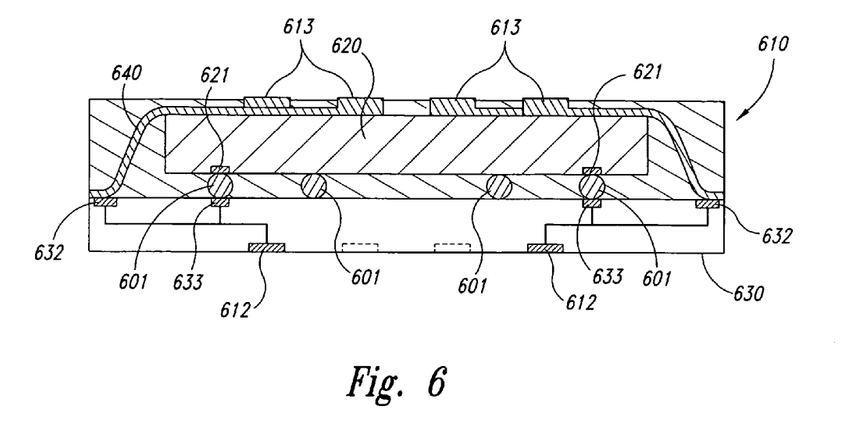
FIG. 6 is a partially schematic, cross-sectional side view of a package that includes a microelectronic die coupled to a support member with a leadframe and solder balls in accordance with another embodiment of the invention.

FIG. 6 illustrates a package 610 that includes a support member 630 carrying a die 620 that is electrically coupled to the support member 630 via solder balls 601. Accordingly, the die 620 can include die bond sites or bond pads 621 that face toward corresponding support member bond sites 633, with the solder balls 601 positioned in between. Some of the die bond sites 621 and support member bond sites 633 may be offset from the plane of FIG. 6 and therefore not visible. The support member bond sites 633 can be coupled to first package bond sites 612 and leadframe bond sites 632 in a manner generally similar to that described above. A leadframe 640 can be attached to the leadframe bond site 632 and can carry second package bond sites 613 positioned to face in a direction opposite that of the first package bond sites 612, also in a manner generally similar to that described above.

Figure 7:
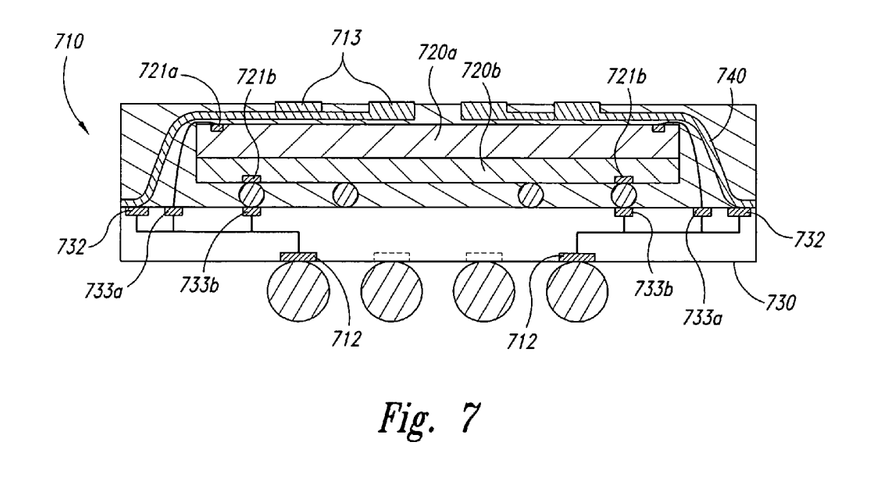
FIG. 7 is a partially schematic, cross-sectional side view of a package that includes two stacked microelectronic dies electrically coupled to a leadframe in accordance with another embodiment of the invention.

FIG. 7 is a partially schematic, cross-sectional side view of a package 710 that includes multiple microelectronic dies positioned within the same volume of encapsulant, and electrically coupled to the same leadframe 740. For example, the package 710 can include two microelectronic dies 720, shown as a first microelectronic die 720a and a second microelectronic die 720b, stacked one upon the other, with the second microelectronic die 720b positioned between the first die 720a and a support member 730. The second microelectronic die 720b can include die bond sites 721b that are electrically coupled to the support member 730 in a manner generally similar to that described above with reference to FIG. 6. The first microelectronic die 720a can include die bond sites 721a that are electrically coupled to the support member 730 in a manner generally similar to that described above with reference to either FIG. 4 or FIG. 5. The internal circuitry within the support member 730 can couple first support member bond sites 733a and second support member bond site 733b to first package bond sites 712 and to leadframe bond sites 732. A leadframe 740 having second package bond sites 713 is electrically connected to the leadframe bond sites 732 and extends over the composite of the first microelectronic die 720a and the second microelectronic die 720b. Accordingly, an advantage of an arrangement shown in FIG. 7 is that the overall thickness of the composite may be less than the thickness of the stacked die arrangement shown in FIG. 1. Conversely, an advantage of an embodiment shown in FIG. 1 is that each microelectronic die can be individually tested prior to stacking the packages shown in the manner as shown in FIG. 1.

Figure 8:
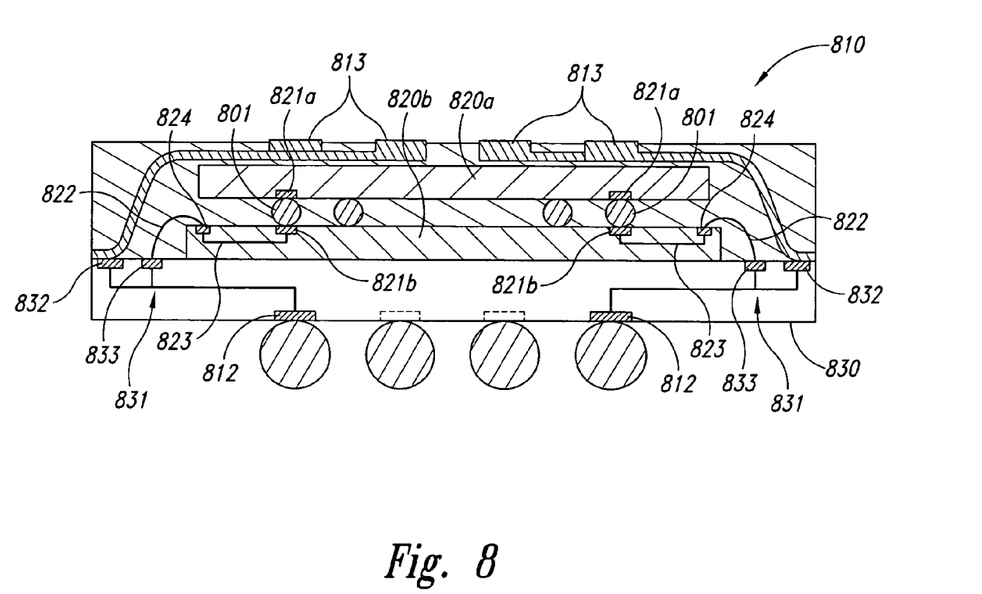
FIG. 8 is a partially schematic, cross-sectional side view of a package that includes two stacked microelectronic dies coupled to a single leadframe in accordance with still another embodiment of the invention.

FIG. 8 is a partially schematic, cross-sectional side view of a package 810 having first and second microelectronic dies 820a, 820b arranged in generally the opposite fashion from that shown in FIG. 7. Accordingly, the second die 820b can be connected to the corresponding support member 830 with wire bonds 822, and the first die 820a can be coupled to the second die 820b with solder balls 801. In a particular aspect of this embodiment, the second die 820b can include second die bond sites 821b and redistribution lines 823 that connect the second die bond sites 821b with intermediate bond sites 824. The first die 820a can be connected directly to the second die bond sites 821b with the solder balls 801, and the second die 820b can be connected to the support member 830 with wire bonds 822 connected between the intermediate bond sites 824 and corresponding support member bond sites 833. The support member bond sites 833 can be coupled to first package bond sites 812 and leadframe bond sites 832 via support member circuitry 831. The leadframe bond sites 832 are in turn connected to second package bond sites 813 via a corresponding leadframe 840.

From the foregoing, it will be appreciated that specific embodiments of the invention have been described herein for purposes of illustration, but that various modifications may be made without deviating from the scope of the invention. For example, the microelectronic dies can have configurations other than those shown in the Figures and/or can be combined in manners other than those shown in the Figures. In certain embodiments, when packages are stacked on each other, they need not have the same configuration. For example, the upper package may have no second package bond sites, a different leadframe arrangement than that of the lower package, or no leadframe at all. The bond sites, electrical couplers and circuitry can be arranged and/or combined in manners other than those discussed above and shown in the Figures. Although advantages associated with certain embodiments of the invention have been described in the context of those embodiments, other embodiments may also exhibit such advantages. Additionally, none of the foregoing embodiments need necessarily exhibit such advantages to fall within the scope of the invention. Accordingly, the invention is not limited except as by the appended claims.

We claim:

1. A microelectronic die system, comprising:
   a support member having first package bond sites and leadframe bond sites that are electrically coupled to the first package bond sites;
   a microelectronic die carried by the support member and electrically coupled to the first package bond sites;
   a leadframe attached to the leadframe bond sites and extending adjacent to the microelectronic die, with the microelectronic die positioned between the leadframe and the support member, the leadframe having second package bond sites facing away from the first package bond sites; and
   an encapsulant at least partially surrounding the leadframe and the microelectronic die, wherein the first package bond sites are accessible from outside the encapsulant and the second package bond sites are exposed through the encapsulant.

2. The system of claim 1 wherein the first and second package bond sites both have generally flat bonding surfaces.

3. The system of claim 1 wherein the leadframe is attached directly to the microelectronic die with an adhesive.

4. The system of claim 1 wherein the leadframe is self-supporting.

5. The system of claim 1 wherein no support member is interposed between the leadframe and the microelectronic die.

6. The system of claim 1 wherein the second bond sites face away from the microelectronic die.

7. The system of claim 1 wherein the microelectronic die is electrically connected to the support member with wirebonds.

8. The system of claim 1 wherein the microelectronic die is electrically connected to the support member with solder balls.

9. The system of claim 1 wherein the microelectronic die is the first of two microelectronic dies carried by the support member, and wherein both the first and second microelectronic dies are positioned between the support member and the leadframe.

10. The system of claim 9 wherein the first microelectronic die is positioned adjacent to the leadframe and the second microelectronic die is positioned between the first microelectronic die and the support member, and wherein the second microelectronic die is electrically connected to the support member with wirebonds, and the first microelectronic die is electrically connected to the second microelectronic die with solder.

11. The system of claim 9 wherein the first microelectronic die is positioned adjacent to the leadframe and the second microelectronic die is positioned between the first microelectronic die and the support member, and wherein the second microelectronic die is electrically connected to the support member with solder balls, and the first microelectronic die is electrically connected to the support member with wirebonds.

12. The system of claim 1 wherein the microelectronic die has a first surface facing toward the support member and a second surface facing away from the support member and toward the leadframe, and wherein the microelectronic die is electrically coupled to the first package bond sites via wirebonds connected to die bond pads accessible from the first surface of the microelectronic die.

13. The system of claim 1 wherein the microelectronic die has a first surface facing toward the support member and a second surface facing away from the support member and toward the leadframe, and wherein the microelectronic die is electrically coupled to the first package bond sites via wirebonds connected to die bond pads accessible from the second surface of the microelectronic die.

14. The system of claim 1 wherein the support member, the microelectronic die, the leadframe and the encapsulant form a first microelectronic package, and wherein the system further comprises a second microelectronic package stacked on the first and electrically connected to the second package bond sites of the first microelectronic package.

15. The system of claim 14 wherein the second microelectronic package does not have second package bond sites accessible for electrical coupling.

16. The system of claim 1 wherein individual leadfingers of the leadframe have a leadfinger surface facing in a first direction and located in a leadfinger plane, wherein the second package bond sites are offset away from the leadfinger plane in the first direction.

17. The system of claim 16 wherein the leadfinger surface is a first leadfinger surface, and wherein the individual leadfingers have a generally flat second leadfinger surface facing in a second direction opposite the first direction.

18. The system of claim 1 wherein the leadframe does not have wire bonds connected to it.

19. The system of claim 18 wherein the microelectronic die is electrically coupled to the support member with wire bonds.

20. The system of claim 1 wherein the support member includes a circuit board.

21. The system of claim 1, further comprising an external device connected to the first package bond sites.

22. A microelectronic die system, comprising:
   first and second microelectronic die packages, each having:
      a support member having first package bond sites and leadframe bond sites that are electrically coupled to the first package bond sites;
      a microelectronic die carried by the support member and electrically coupled to the first package bond sites;
      a leadframe attached to the leadframe bond sites and extending adjacent to the microelectronic die, with the microelectronic die positioned between the leadframe and the support member, the leadframe having second package bond sites facing away from the first package bond sites; and
      an encapsulant at least partially surrounding the leadframe and the microelectronic die, wherein the first package bond sites are accessible from outside the encapsulant and the second package bond sites are exposed through the encapsulant;
   wherein at least the first microelectronic die package has both the first and second package bond sites accessible from outside the encapsulant and wherein the second microelectronic die package is stacked relative to the first microelectronic die package, with the first package bond sites of the second microelectronic die package electrically connected to the second package bond sites of the first microelectronic die package.

23. The system of claim 22 wherein the encapsulant of the first microelectronic die package is not integrated with the encapsulant of the second microelectronic die package, and wherein the first and second microelectronic die packages are attachable to and separable from each other at junctions between the first package bond sites of the second microelectronic die package and the second package bond sites of the first microelectronic die package.

24. The system of claim 22 wherein the second microelectronic package does not have second package bond sites accessible for electrical coupling.

25. The system of claim 22 wherein the second microelectronic package has a configuration generally identical to that of the first microelectronic package, but with second package bond sites that are not accessible for electrical coupling.

26. The system of claim 22 wherein the leadframe does not have wire bonds connected to it.

27. The system of claim 26 wherein the microelectronic die is electrically coupled to the support member with wire bonds.

28. The system of claim 22 wherein the support member includes a circuit board.

29. The system of claim 22 wherein the support member is the only support member within the encapsulant.

30. The system of claim 22 wherein the leadframe is generally encased by the encapsulant except at the second package bond sites.

31. The system of claim 22 wherein individual leadfingers of the leadframe have a leadfinger surface facing in a first direction and located in a leadfinger plane, wherein the second package bond sites are offset away from the leadfinger plane in the first direction.

32. A microelectronic die system, comprising:
   a support member having first package bond sites and leadframe bond sites that are electrically coupled to the first package bond sites;
   a microelectronic die carried by the support member and electrically coupled to the first package bond sites;
   a leadframe attached to the leadframe bond sites and extending adjacent to the microelectronic die, with the microelectronic die positioned between the leadframe and the support member, the leadframe including individual leadfingers having a first leadfinger surface facing the microelectronic die, a second leadfinger surface facing opposite from the first leadfinger surface, and a second package bond site having a bonding surface generally parallel to and offset from the second leadfinger surface; and
   an encapsulant at least partially surrounding the leadframe and the microelectronic die, wherein the first package bond sites are accessible from outside the encapsulant, the second leadfinger surfaces are covered by the encapsulant, and the bonding surfaces are exposed through the encapsulant.

33. The system of claim 32 wherein the encapsulant surrounds the individual second package bond sites.

34. The system of claim 32 wherein the individual bonding surface are offset in a direction away from the microelectronic die.

35. The system of claim 32 wherein the second package bond sites face away from the first package bond sites.

36. The system of claim 32 wherein a thickness of the encapsulant covering the individual second leadfinger surfaces is approximately equal to the offset of the individual bonding surfaces from the corresponding second leadfinger surface.

37. The system of claim 32 wherein a thickness of the encapsulant covering the second leadfinger surfaces is greater than the offset of the individual bonding surfaces from the second leadfinger surface.

38. The system of claim 37 wherein the encapsulant comprises wells over the individual bonding surfaces.

* * * * *